United States Patent [19]

Kimmel et al.

[11] Patent Number: 4,704,599
[45] Date of Patent: Nov. 3, 1987

[54] AUXILIARY POWER CONNECTOR AND COMMUNICATION CHANNEL CONTROL CIRCUIT

[76] Inventors: Arthur T. Kimmel, 4322 Windward Cir., Dallas, Tex. 75252; Harold W. Dozier, 2218 Ridgewood, Carrollton, Tex. 75006

[21] Appl. No.: 622,740

[22] Filed: Jun. 20, 1984

[51] Int. Cl.$^4$ .............................................. G08B 1/00
[52] U.S. Cl. .................................... 340/333; 307/140; 307/149; 361/119; 361/413
[58] Field of Search .................. 361/415, 413, 119; 307/139, 140, 147, 149; 340/333

[56] References Cited

U.S. PATENT DOCUMENTS

| | | | |
|---|---|---|---|
| 3,691,399 | 9/1972 | Vinch et al. | 307/149 |
| 4,151,580 | 4/1979 | Struger et al. | 361/415 |
| 4,356,550 | 10/1982 | Katzman et al. | 364/200 |
| 4,609,829 | 9/1986 | Milby et al. | 361/415 |

FOREIGN PATENT DOCUMENTS 0072103  6/1977  Japan .................................. 361/415

Primary Examiner—John W. Caldwell, Sr.
Assistant Examiner—David W. Olson
Attorney, Agent, or Firm—Richards, Harris, Medlock & Andrews

[57] ABSTRACT

An auxiliary connector circuit is used within an electronic system (10) which comprises a plurality of removable circuit cards (14, 16, 18, 20, 22, 24, 26) which are mounted within a cabinet (12). Before the circuit card (16) is removed from the cabinet (12), a power cable (44) is connected by means of engaging a plug (46) to a socket (34). When this occurs a DATA OUT ENABLE signal at a line (65) drives three-state devices (86, 88, 90, 92, 94, 96, 98 and 100) to a high impedance state to isolate a memory array (78) from a data bus (102). This high impedance prevents any transients from being transmitted through the data bus (102) when the card (16) is removed from the cabinet (12). After the card (16) is removed from the cabinet (12), the power cable (44) can be disconnected from the card (16) or the card (16) can be tested to evaluate the components mounted on the card (16).

7 Claims, 3 Drawing Figures

AUXILIARY POWER CONNECTOR AND COMMUNICATION CHANNEL CONTROL CIRCUIT

TECHNICAL FIELD

The present invention pertains to electronic systems having removable circuit cards and in particular to the provision of auxiliary power for such cards.

BACKGROUND OF THE INVENTION

A typical configuration for a complex electronic system, such as a computer, is a rack mount in which a plurality of circuit cards are mounted in slots within a cabinet. The cards have pin connectors that engage a back plane which is wired to provide the inner connection between the cards. A power supply is conventionally included within the cabinet to provide electrical power for operating the circuit cards. There are typically many connections between the circuit cards and the back plane wherein the connections provide data channels, control signals and power.

In the testing or maintenance of such a system it is frequently necessary to remove one of the circuit cards. If this is done while the system is under power, there is an abrupt and uneven break in the data and power lines. This break can produce noise signals which are transmitted through the communications and control lines and can possibly cause the loss of data or produce an undesired control response. It has, therefore, become the conventional practice to disconnect power for a whole system before any of the circuit cards in it are removed. However, in many cases it is desirable to remove one circuit card while the reminder of the system continues to function. This can be to aid in the diagnosis of a problem or to permit the continued processing of data by the reminder of the system.

In view of these problems there exists a need for apparatus and circuitry to permit a circuit board to be removed from a system, while the system is powered, without the production of undesired transient or control signals that could interrupt the operation of the system.

SUMMARY OF THE INVENTION

A selected embodiment of the present invention comprises an auxiliary connector circuit for an electronic system having a power supply, at least one removable circuit card and a communication channel connection between the circuit card and another part of the system. A power cable is connected to the power supply. Circuitry is provided for removably connecting the power cable to the circuit card for providing power to the circuit card. Circuitry on the card produces a control signal when the power cable is connected to the circuit card. Further circuitry is responsive to the control signal for opening the communication channel to prevent electrical transmission through the communication channel between the circuit card and the remainder of the system.

DETAILED DESCRIPTION OF THE DRAWING

Figure 1:
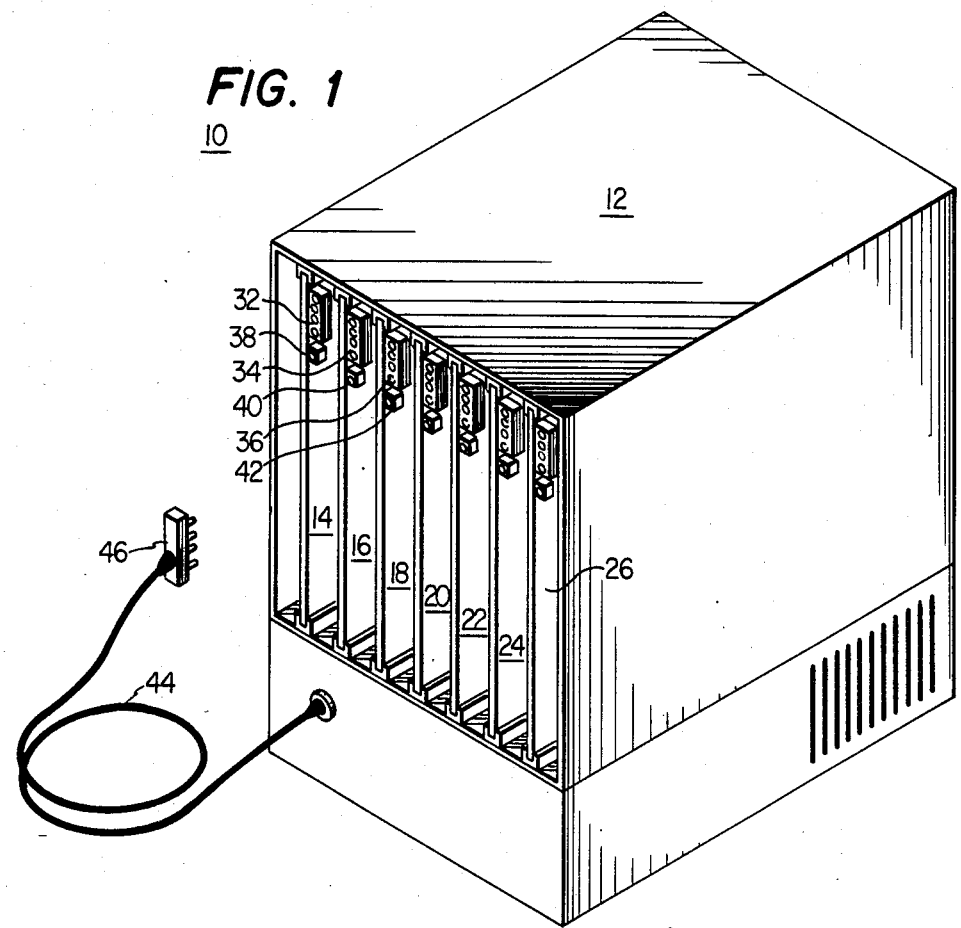
Figure 2:
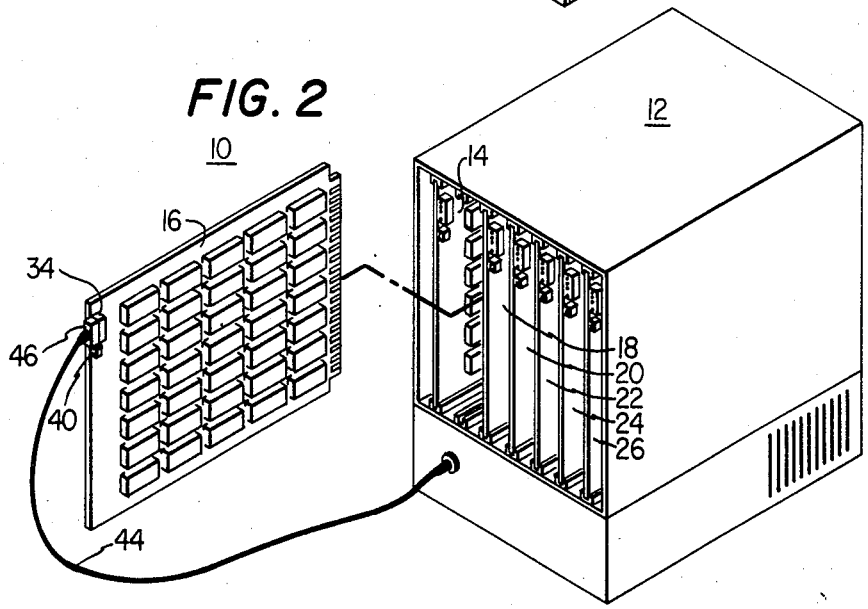
Figure 3:
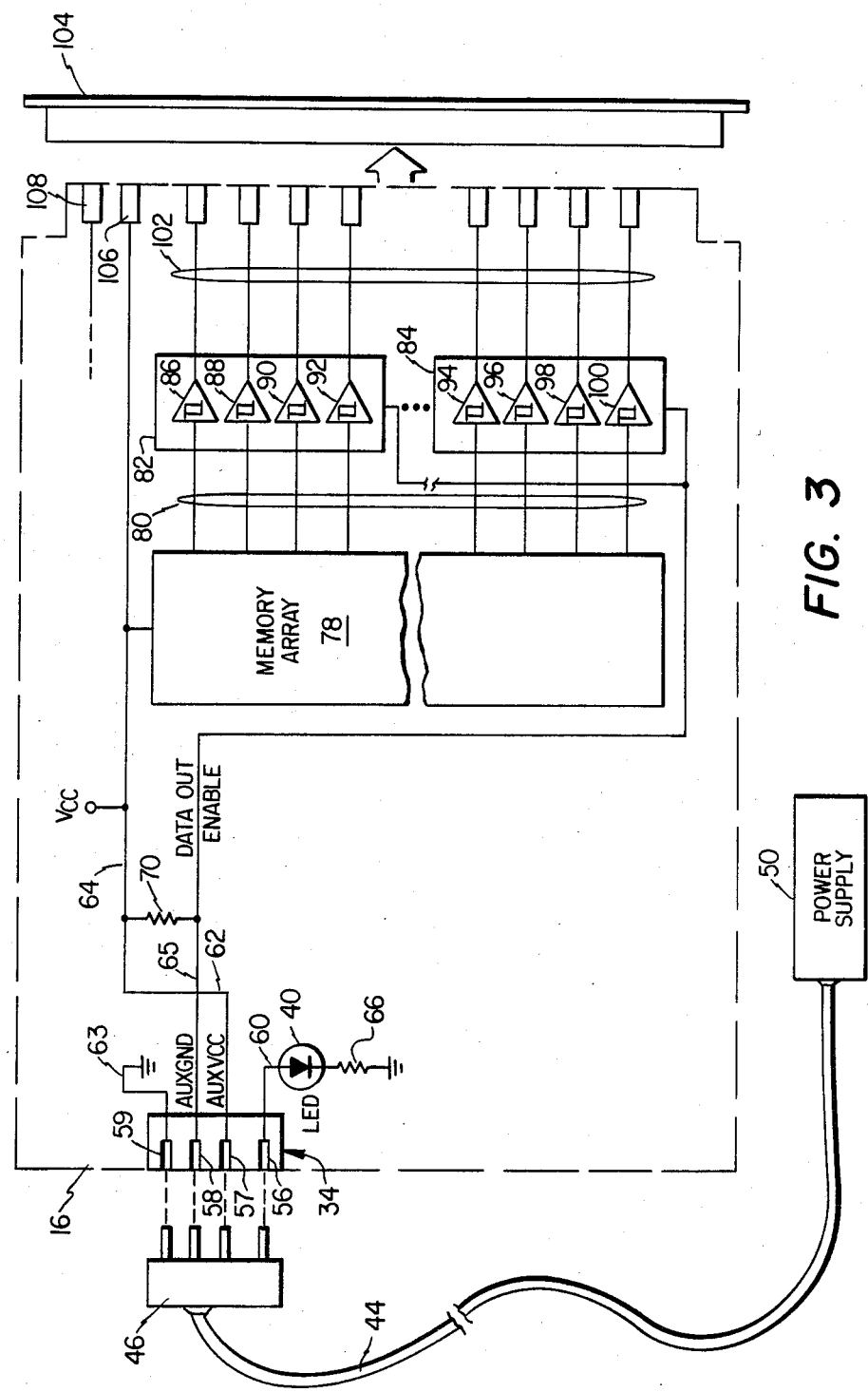

For more complete understanding of the present invention and the advantages thereof, reference is now made to the following description taken in conjunction with the accompanying drawings which:

FIG. 1 is a perspective view of an electronic system having a plurality of circuit cards installed in a cabinet, FIG. 2 is an illustration of the electronic system shown in FIG. 1 wherein one of the circuit cards is removed from the cabinet after connection of an auxiliary power cable to the circuit card, and FIG. 3 is a schematic illustration of the connector circuit on the removable circuit card in accordance with the present invention.

DETAILED DESCRIPTION OF THE INVENTION

The present invention comprises apparatus for providing a power connection to a circuit card before it is removed from a cabinet and while the remainder of the system continues to receive power and operate.

Referring now to FIG. 1 there is illustrated an electronic system 10 which is, for example, a computer. The system 10 is mounted within a cabinet 12, which contains a plurality of vertically mounted and slidably removable circuit cards 14, 16, 18, 20, 22, 24 and 26. These cards comprise various elements of the electronic system 10 such as memory, memory control, central processor and input/output processors. Each of the circuit cards 14-26 is inserted within upper and lower grooves in the cabinet 12. The back of the cabinet 12 includes a back plane wiring and a plurality of pin connectors which receive pins from the various circuit cards for interconnecting the circuit cards to the back plane wiring. Cards 14 and 16 are used herein as main memory for the electronic system 10. These cards, along with card 18, are provided with respective connector sockets 32, 34 and 36. Cards 14, 16 and 18 are further equipped with respective indicator lights 38, 40 and 42.

A power cable 44 is connected to a power supply, described below, for the system 10. A connector plug 46 is mounted on the free end of cable 44. The plug 46 has four extending pins which are received into corresponding holes in any one of the sockets 32, 34 and 36.

Referring to FIG. 2, the circuit card 16 has been removed from cabinet 12 after the power cable 44 has been connected to the circuit card 16. The cable 44 supplies power to the circuit card 16 so that the integrated circuits thereon may continue to function. Power is maintained to the remainder of the system 10 when the circuit card 16 is removed from the cabinet 12.

Referring now to FIG. 3, there is illustrated in detail a portion of the circuit card 16. The power cable 44 is connected to a power supply 50.

Plug 46 can be removably connected to the socket 34. Socket 34 has four terminals 56, 57, 58 and 59. Terminal 56 is connected to a line 60 which is connected to the light indicator 40. Terminal 57 is connected to a line 62 which is termed auxiliary VCC (AUXVCC) which is further connected to a power terminal 64. Terminal 58 is connected to a line 65 which is termed auxiliary ground (AUXGND). Terminal 59 is connected through a line 63 to the ground for card 16. Line 65 also comprises a data out enable.

The light indicator 40, comprising a light emitting diode (LED), is connected in series with a resistor 66 between line 60 and circuit ground.

A resistor 70 is connected between line 65 and the power terminal 64.

A memory array 78 comprises a plurality of dynamic random access memories mounted on the circuit card 16. These memories are powered by connection to the power terminal 64. Data is written into the array 78 and transmitted from the array 78 through a plurality of lines 80. The lines 80 are connected to the inputs of a plurality of circuits 82 and 84. The circuits 82 and 84 each contain a plurality of three-state devices shown by the reference numerals 86, 88, 90, 92, 94, 96, 98 and 100. There is a three-state device connected in series with each of the lines 80. The circuits 82 and 84 are, for example, a model 74F244 manufactured by Fairchild Camera and Instrument Company. The DATA OUT ENABLE line 65 is connected to the circuits 82 and 84 for activating the three-state devices therein.

The outputs of the circuits 82 and 84 are connected to the lines of a data bus 102. Data bus 102 comprises a communication channel between card 16 and the remainder of the electronic system 10. The bus 102 is connected from circuit 16 to a back plane 104.

The power terminal 64 (VCC) is further connected to a terminal 106 while other control signals from the circuit card 16 are connected to other terminals such as 108. When the card 16 is inserted into the cabinet 12, the lines of the data bus 102 and the terminals 106 and 108 are connected to corresponding elements in the back plane 104.

Operation of the auxiliary connector circuit of the present invention is now described in reference to FIGS. 1, 2 and 3. In routine operation all of the circuit cards 14 through 26 are inserted into the cabinet 12 so that the system 10 may function as designed. At times it is necessary to remove one of the circuit cards to either validate its operation or to repair a fault. In previous systems it has been the conventional rule that power for the system 10 must be terminated before any circuit card is removed. This is due to the possibility of producing transients as the circuit terminals are opened between the card and the back plane. These transient signals can cause the loss of data, produce erroneous data, produce erroneous control signals and possibly even damage circuit elements. In the present invention the cable 44 is connected by inserting the plug 46 into one of the sockets 32, 34 or 36 while the corresponding circuit card is mounted within the cabinet 12 and power is supplied to the system 10. The circuit card remains operational while the cable 44 is connected thereto. At the time the cable 44 is connected to one of the circuit cards, the indicator light for that circuit card, such as light 40 for card 16, is activated to indicate that the power cable is securely connected to the circuit card.

After the power cable 44 has been connected to one of the circuit cards, the card, as shown in FIG. 2, can be removed from the cabinet 12. This is shown for circuit card 16. The light 40 is activated to produce an output from the time that the cable 44 is connected to the card 16. The cable 44 provides the power necessary to operate the card 16.

Referring now to FIG. 3, the power supply 50 typically supplies power, through the terminal 64, termed VCC, during routine operation of the system 10 while the circuit cards are installed within the cabinet 12. The power supply is connected to the cable 44 for producing an auxiliary power signal that is supplied through cable 44.

Before the plug 46 is mated with the socket 34, the DATA OUT ENABLE signal at line 65 is pulled to a high voltage state through the resistor 70. This high voltage state comprises a command that is transmitted to the circuits 82 and 84 to permit the three-state devices 86–100 to transmit data therethrough between the lines 80 and the data bus 102. There is no power supplied to line 60, therefore, the light indicator 40 does not produce an output.

When the plug 46 is connected to the socket 34, the VCC signal produced by the power supply 50 is transmitted through terminal 57 and line 62 to the power terminal 64. The ground from the power supply 50 is transmitted through terminal 59 and line 63 to the circuit card ground. The LED signal transmitted through terminal 57 also activates the light indicator 40 to produce light indicating that the cable 44 is connected and is suppling power to the card 16. A ground is supplied through terminal 58 to pull line 65 to ground potential, thereby driving the DATA OUT ENABLE signal to a second state. In the second state, ground, the circuits 82 and 84 have the three-state devices therein driven to a high impedance state. Under this condition the data bus 102 receives a high impedance condition from the circuits 82 and 84. This high impedance condition isolates the data bus 102 from the lines 80. Thus, when the plug 46 is connected to the circuit card 16, the communication channel between circuit card 16 and the remainder of the system 10 is broken by the imposition of a high impedance in the line. This occurs before the circuit card 16 is removed from cabinet 12. Thus, when a circuit card is removed, any transient signals that are produced cannot be transferred to the data bus 102 due to the high impedance of the circuits 82 and 84. However, the circuits on the cards 16 remain powered so that test signals can be applied to the circuit for testing and evaluation of components on the card 16.

After the card 16 has been removed from the cabinet 12, the cable 44 can be disconnected from the card 16.

If it is desired to insert a new card into the system 10 while it is activated, the cable 44 is connected to the new card so that the circuit elements on the card are powered up, including the capacitors therein, and the card is then inserted into the cabinet 12. After the card is securely connected to the back plane 104 of the system 10, the auxiliary power cable 44 is disconnected from the circuit card and this allows the DATA OUT ENABLE signal at line 65 to return to a high state thereby enabling the circuits 82 and 84, and the three-state devices therein, so that data communication can take place between the memory array 78 and the data bus 102.

In summary, the present invention comprises circuitry for supplying auxiliary power to a circuit card which can be removed from a system while the system remains powered. While the card is still within the system, the data communication and control channels between the card to be removed and the remainder of the system are broken by a high impedance so no transient signals can be transmitted to the system to produce erroneous data, erroneous commands or to damage any circuit components.

Although one embodiment of the invention has been illustrated in the accompanying drawings and described in the foregoing Detailed Description, it will be understood that the invention is not limited to the embodiment disclosed, but is capable of numerous rearrangments, modifications and substitutions of parts and elements without departing from the scope of the invention.

We claim:

1. An auxiliary connector circuit for an electronic system having a power supply, at least one removable circuit card and a communication channel connection between the circuit card and another part of the system, comprising:
- a power cable connected to said power supply,
- means for removably connecting said power cable to said circuit card for providing power to said circuit card,
- means on said circuit card for producing a control signal when said power cable is connected to said circuit card, and
- means responsive to said control signal for opening said communication channel to prevent electrical transmission through said communication channel between said circuit card and the remainder of said system.

2. An auxiliary connector circuit as recited in claim 1 wherein said means for removably connecting said power cable comprises a plug and socket assembly mounted on said circuit card and on said power cable.

3. An auxiliary connector circuit as recited in claim 1 wherein said means for producing a control signal comprises a resistor connected between a power terminal of said circuit card and a node which receives a connection from said power cable, said control signal produced at said node, wherein said node is pulled to a first state when said power cable is not connected to said circuit card and said node is driven to a second state when said power cable is connected to said circuit card.

4. An auxiliary connector circuit as recited in claim 1 wherein said means for opening said communication channel comprises a three-state device responsive to said control signal for applying a high impedance state to said channel at said circuit card.

5. An auxiliary connector circuit as recited in claim 1 further including an indicator light mounted on said circuit board and means for activiting said light when said power cable is connected to said circuit board.

6. An auxiliary connector circuit for an electronic system having a power supply, at least one removable circuit card and a communication channel between the circuit card and another part of the system, comprising:
- a power cable connected to said power supply,
- a plug connected to the free end of said cable,
- a power bus and ground line on said circuit card,
- a socket mounted on said circuit card and having a first terminal thereof connected to said power bus and a second terminal thereof connected to said ground line on said circuit card, wherein power is supplied from said power supply, said cable, said plug, and said socket to said power bus when said plug is engaged to said socket,
- a first resistor connected between said power bus and said second terminal of said socket, where a control signal is produced at said first terminal having a first state when said cable is not connected to said circuit card and a second state when said cable is connected to said circuit card, and
- a three-state device connected in said communication channel and responsive to said control signal to permit electrical transmission through said channel when said control signal is in said first state and prevent electrical transmission through said channel when said control signal is in said second state.

7. An auxiliary connector circuit as recited in claim 6 further including a light emitting diode coupled between said first terminal and said ground line wherein said diode produces light when said cable is connected to said circuit card.

* * * * *